(12) United States Patent
Hutchinson

(10) Patent No.: US 6,617,082 B2
(45) Date of Patent: Sep. 9, 2003

(54) MICROELECTROMECHANICAL SYSTEM MASK

(75) Inventor: John Hutchinson, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/895,696

(22) Filed: Jun. 29, 2001

(65) Prior Publication Data

US 2003/0003372 A1 Jan. 2, 2003

(51) Int. Cl.[7] .............................. G03F 9/00; G03B 27/00; G02B 26/00
(52) U.S. Cl. ........................... 430/5; 359/359; 355/53
(58) Field of Search .......................... 430/5; 359/359; 355/53, 67; 378/82, 84

(56) References Cited

U.S. PATENT DOCUMENTS

| | | | | |
|---|---|---|---|---|
| 6,011,646 A | * | 1/2000 | Mirkarimi et al. | 359/359 |
| 6,188,519 B1 | * | 2/2001 | Johnson | 359/572 |
| 2002/0101644 A1 | * | 8/2002 | Mei et al. | 359/290 |
| 2002/1416648 | * | 10/2002 | Ghandehari et al. | 430/324 |

* cited by examiner

Primary Examiner—Mark F. Huff
Assistant Examiner—Kripa Sagar
(74) Attorney, Agent, or Firm—George Chen

(57) ABSTRACT

The present invention discloses a microelectromechanical system mask with an array of reflectors, each reflector having two mirrors separated from each other by an adjustable gap.

19 Claims, 2 Drawing Sheets

MICROELECTROMECHANICAL SYSTEM MASK

BACKGROUND OF THE INVENTION

1. Field of the Invention

The present invention relates to the field of semiconductor integrated circuit manufacturing, and more specifically, to a mask for extreme ultraviolet (EUV) lithography.

2. Discussion of Related Art

Continual improvements in optical lithography have allowed the shrinkage of semiconductor integrated circuits (IC) to produce devices with higher density and better performance. Decreasing the wavelength used for exposure improves resolution and mitigates the effects of diffraction. Deep ultraviolet (DUV) light with a wavelength of 248 or 193 nanometers (nm) is widely used for exposure through a transmissive mask fabricated from a quartz substrate. DUV light with a wavelength of 157 or 126 nm may be used for exposure through a transmissive mask made from Calcium Fluoride. However, Next Generation Lithography (NGL) will be needed to print features with a critical dimension (CD) below 70 run.

NGL includes many different types of technology, such as EUV lithography, electron projection lithography (EPL), and proximity x-ray lithography (PXL). In order to achieve and sustain volume production, each technology will have to address and resolve many technical challenges, including the following. PXL is constrained by the difficulty of writing 1X-masks. Throughput for EPL is degraded whenever a complementary pattern must be exposed since two passes are inherently required for a stencil mask. EUV masks are expensive to fabricate due to the complexity of the processing.

To a large extent, the choice of technology for NGL depends on the desired application. However, EUV lithography appears to be the technology that can best leverage the IC industry's existing infrastructure in DUV lithography.

EUV lithography is performed at an incidence angle of about 5 degrees with light having wavelengths of 11–15 nm. The central peak is at about 13.4 nm. Since most condensed materials absorb at EUV wavelengths, a mask for EUV lithography is typically reflective. FIG. 1(a) shows a conventional EUV mask 170 with a fixed pattern including a reflective region 173 and an anti-reflective region 176.

FIG. 1(b) shows a conventional EUV mask 170 that is fabricated on a substrate 105 having a very low coefficient of thermal expansion. First, a multilayer (ML) mirror 115 is formed over the substrate 105. The ML mirror 115 is formed from alternating layers of a high index of refraction material 111, such as 2.8 nm thick Molybdenum, and a low index of refraction material 113, such as 4.1 nm Silicon. Second, an absorber layer 125 is formed over the ML mirror 115. Third, the EUV mask 170 is patterned by lithography and etching. The absorber layer 125 is removed in some areas of the EUV mask 170 to form the reflective region 173 and left intact in other areas of the EUV mask 170 to form the antireflective region 176.

An EUV mask is costly to fabricate partly because defects in the ML mirror cannot be repaired. An advanced IC may be fabricated from about 15–30 lithography layers, of which 2–6 may be considered to be critical. Each lithography layer requires 1–2 masks so mask costs for EUV lithography can quickly become prohibitive. Consequently, reducing the cost of the mask for EUV lithography will increase the competitiveness of this technology for NGL.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

The present invention describes a microelectromechanical system (MEMS) mask for lithography. A conventional mask for lithography is fabricated with a fixed pattern. In contrast, a MEMS mask according to the present invention may be reconfigured to accommodate different layouts for an IC, thus potentially making it unnecessary to fabricate separate masks for each layer of a product. It may become possible to avoid switching masks in a wafer stepper tool to expose different layers of a product, thus improving the consistency of the exposure and increasing the throughput of the tool. A MEMS mask may further be reconfigured to accommodate any design change that is subsequently needed, thus avoiding the time and expense required for fabricating a replacement mask and matching it with the original mask. If desired, a MEMS mask may also be reconfigured to compensate for known variations in the process and the tool.

A MEMS mask of the claimed invention may be designed to operate in a transmissive mode or a reflective mode. In general, the reflective mode has higher optical efficiency than the transmissive mode. A mask for EUV lithography typically uses the reflective mode.

Figure 1A:
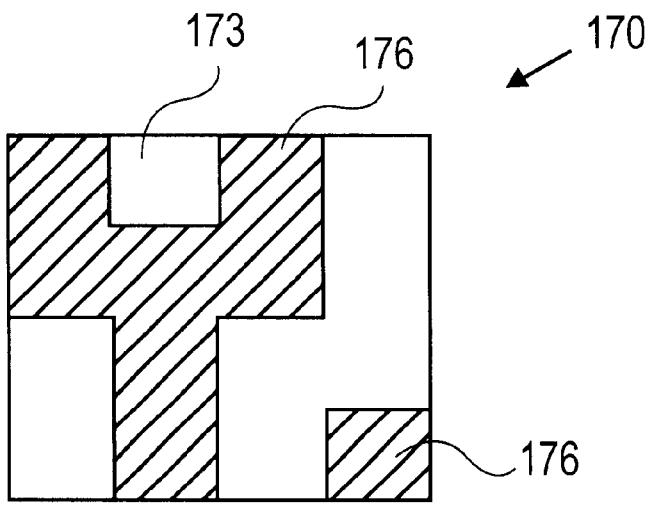
FIG. 1(a) is an illustration of a plane view of a conventional EUV mask in the prior art.
Figure 1B:
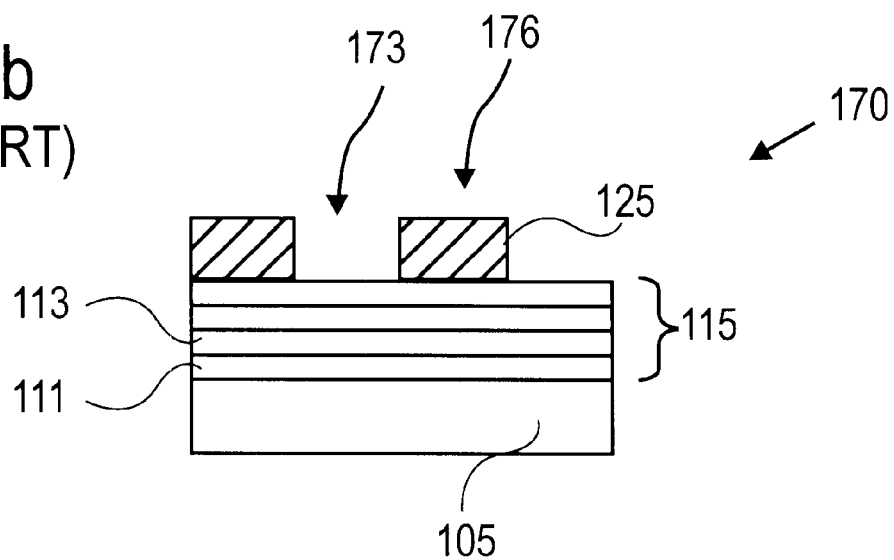
FIG. 1(b) is an illustration of a cross-sectional view of a conventional EUV mask in the prior art.
Figure 2:
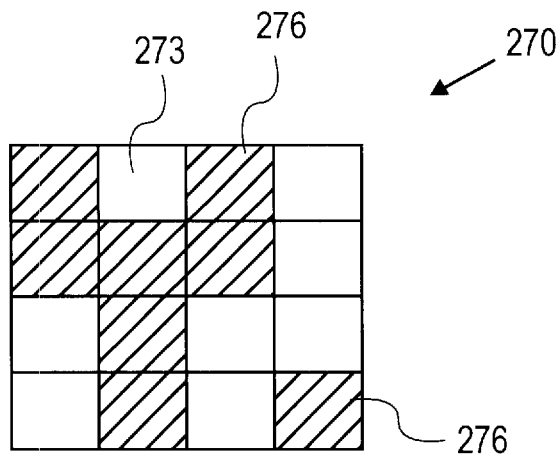
FIG. 2 is an illustration of a plane view of a MEMS EUV mask formed from an array of reflectors according to the present invention.

As shown in FIG. 2, a reflective MEMS mask 270 as claimed in the present invention includes a plurality of reflectors. In one embodiment, the reflectors may be arranged in an array. The array of reflectors should have a high optical fill factor, such as 95%, in order to minimize the creation of artifacts between the reflectors when the MEMS mask is in use. Fill factor is determined by the size and spacing of the reflectors within the array. The array of reflectors must also be able to withstand a high optical power density in order to allow sufficiently fast wafer processing.

Figure 3A:
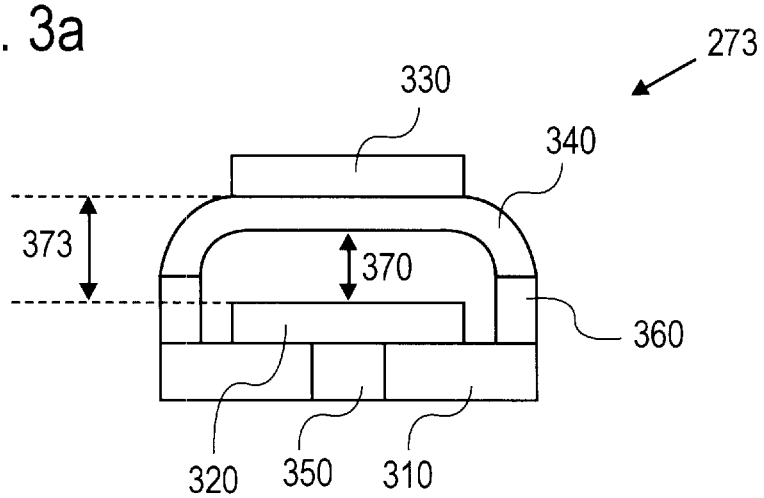
FIG. 3(a) is an illustration of a cross-sectional view of a reflector in a MEMS EUV mask that is in a reflective state according to the present invention.

Each reflector in the array is individually controlled to be in a reflective state 273 or an anti-reflective state 276. A computer may be used to control the array of reflectors. Each reflector resembles a miniature interferometer that can be fabricated using MEMS techniques. In one embodiment, each reflector has two mirrors. As shown in FIG. 3(a), each reflector has a lower mirror 320. The lower mirror 320 is highly reflective. For example, the lower mirror 320 of a MEMS EUV mask may have 40 pairs of alternating layers of molybdenum and silicon.

Each reflector also has an upper mirror 330 that is suspended over the lower mirror 320. The upper mirror 330 is partially reflective. For example, the upper mirror 330 of a MEMS EUV mask may have 13 pairs of alternating layers of molybdenum and silicon.

Figure 3B:
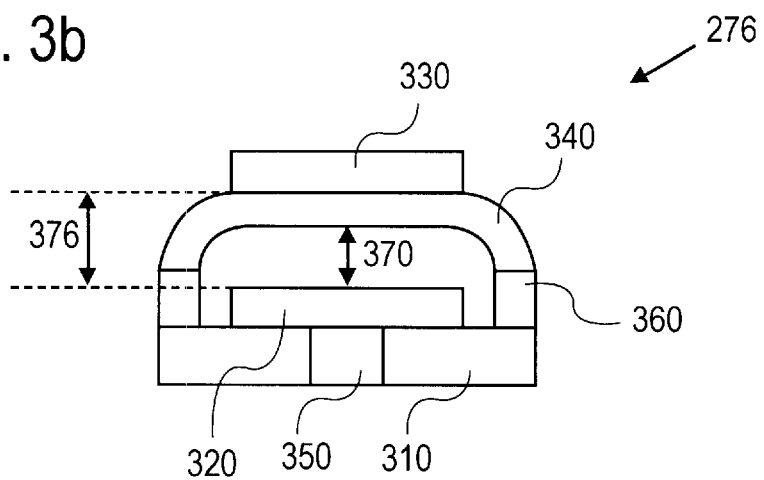
FIG. 3(b) is an illustration of a cross-sectional view of a reflector in a MEMS EUV mask that is in an anti-reflective state according to the present invention.

The upper mirror 330 that is suspended over the lower mirror 320 may be supported by a membrane 340. The membrane 340 may be formed from silicon. The membrane 340 will reduce contrast and introduce a phase shift so the optical response of the reflector may have to be tuned by adjusting the reflective height 373 and the anti-reflective height 376, an embodiment of which is shown in FIG. 3(b).

The membrane 340 may, in turn, be supported by microsprings 360 which are located between adjacent reflectors. The microsprings 360 may be formed from polysilicon. The membrane 340 and the microsprings 360 should be able to move an upper mirror 330 for more than $10^{12}$ switching cycles without any memory effect and without failure.

A gap 370 exists between the top of the lower mirror 320 and the bottom of the membrane 340 that is supporting the upper mirror 330. The reflectance of the reflector depends on the size of the gap 370. The dependence of reflectance on the gap 370 is substantially periodic.

The gap 370 may be controlled electrostatically by applying a voltage to an electrode 350 that is in electrical contact with the lower mirror 320. The applied voltage may be on the order of a few volts, depending on the design. Depending on the polarity selected, the voltage applied to the lower mirror may move the upper mirror relative to the lower mirror.

In one embodiment, the upper mirror 330 may be supported by a membrane 340 with a thickness of about 50.0 nm. When no voltage is applied to the lower mirror 320, the upper mirror 330 would be located at a reflective height 373. The gap 370 would be about 9.5 nm or 17.0 nm. For an EUV mask, this corresponds to a reflectance of about 73 percent.

However, when a small positive voltage of the appropriate magnitude is applied to the lower mirror 320, the upper mirror 330 would be attracted closer to the lower mirror 320. Then the upper mirror 330 would be located at an antireflective height 376. The gap 370 would be about 6.5 nm or 13.0 nm. For an EUV mask, this corresponds to a reflectance of about zero percent.

If desired, gray-scale may be accomplished by using the applied voltage to modulate reflectance to a value between the reflective state 273 and the anti-reflective state 276.

In another embodiment, an array of reflectors may be patterned on top of an array of electronic drivers with control logic. The reflectors may be individually addressed by bitline and wordline and controlled by the drivers in the integrated circuitry. The driver for each reflector would reversibly change the gap between the upper mirror and the lower mirror.

The drivers may be fabricated using CMOS technology. The driver may include an SRAM cell. Signals would control the reflector array through the SRAM array and the control circuits integrated below the reflector array. Each reflector should have a fast response time, such as 15 nanoseconds.

A MEMS mask may be used in an exposure tool to transfer a desired pattern into photoresist (radiation sensitive material) on a wafer. An exposure tool includes an illumination source to provide light energy, an optical package to transfer light energy, and a mask to receive light energy.

Exposure tools include steppers (step-and-repeat tools) as well as scanners (step-and-scan tools). The array of reflectors in a MEMS mask may be controlled prior to receiving light energy. This may be done in a stepper. Alternatively, the array of reflectors may be controlled concurrently with the receipt of light energy. Such dynamic control will allow electronic scanning of a pattern that is physically larger than the actual active area of the MEMS mask. This may be done in a scanner.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

Thus, we have described a MEMS mask for EUV lithography.

I claim:

1. A mask comprising:
    a plurality of reflectors, each reflector comprising:
        a gap
        a first mirror disposed above said gap; and
        a second mirror disposed below said gap.

2. The mask of claim 1 wherein said first mirror comprises 40 pairs of alternating layers of Molybdenum and Silicon.

3. The mask of claim 1 wherein said second mirror comprises 13 pairs of alternating layers of Molybdenum and Silicon.

4. The mask of claim 1 wherein said gap affects reflectance of said reflector.

5. The mask of claim 4 wherein said gap affects reflectance periodically.

6. The mask of claim 1 wherein said gap is adjustable.

7. The mask of claim 1 wherein said gap is adjustable electrostatically.

8. The mask of claim 1 further comprising a computer to control said plurality of reflectors.

9. A mask comprising:
    an array of reflectors, each reflector comprising:
        a lower mirror;
        an upper mirror suspended over said lower mirror; and
        a means for moving said upper mirror.

10. The mask of claim 9 wherein said lower mirror comprises 40 pairs of alternating layers of Molybdenum and Silicon.

11. The mask of claim 9 wherein said upper mirror comprises 13 pairs of alternating layers of Molybdenum and Silicon.

12. The mask of claim 9 further comprising a membrane to support said upper mirror.

13. The mask of claim 12 further comprising microsprings to support said membrane.

14. The mask of claim 9 wherein said means for moving said upper mirror includes applying voltage to said lower mirror.

15. An apparatus comprising:
    an illumination source adapted to provide light energy;
    an optical package adapted to transfer said light energy; and
    a mask adapted to receive said light energy, said mask comprising:

an array of reflectors, each reflector comprising:
- a lower mirror
- an upper mirror separated from said lower mirror by a gap; and
- a driver adapted to adjust said gap to vary said reflector between a reflective state and an anti-reflective state.

16. The apparatus of claim 15 wherein said driver comprises an SRAM cell.

17. The apparatus of claim 15 further comprising a computer adapted to control said array of reflectors.

18. The apparatus of claim 17 wherein said array is controlled prior to said mask receiving said light energy.

19. The apparatus of claim 17 wherein said array is controlled concurrently with said mask receiving said light energy.

* * * * *

UNITED STATES PATENT AND TRADEMARK OFFICE
CERTIFICATE OF CORRECTION

PATENT NO. : 6,617,082 B2
DATED : September 9, 2003
INVENTOR(S) : Hutchinson

It is certified that error appears in the above-identified patent and that said Letters Patent is hereby corrected as shown below:

Column 1,
Line 23, delete "run", insert -- nm --.

Signed and Sealed this

Twenty-fifth Day of November, 2003

JAMES E. ROGAN
*Director of the United States Patent and Trademark Office*